United States Patent [19]
Tamura

[11] Patent Number: 4,647,402
[45] Date of Patent: Mar. 3, 1987

[54] ELECTRO-OPTIC DISPLAY DEVICE AND A METHOD OF PRODUCING THE SAME

[75] Inventor: Katsuhide Tamura, Soka, Japan

[73] Assignee: Canon Kabushiki Kaisha, Tokyo, Japan

[21] Appl. No.: 747,563

[22] Filed: Jun. 21, 1985

Related U.S. Application Data

[62] Division of Ser. No. 271,993, Jun. 9, 1981, Pat. No. 4,587,038.

[30] Foreign Application Priority Data

Jun. 26, 1980 [JP] Japan ............................. 55-87080
Feb. 6, 1981 [JP] Japan ............................. 56-16409

[51] Int. Cl.$^4$ ............................................. H01B 1/06
[52] U.S. Cl. ........................... 252/511; 252/512; 252/514; 252/510; 523/457; 523/458; 523/459; 523/468
[58] Field of Search ............ 252/502, 503, 510, 511, 252/512, 514; 350/334, 363, 336, 357; 523/425, 457–459, 468; 156/330

[56] References Cited

U.S. PATENT DOCUMENTS 3,294,709 12/1966 Nitzsche et al. ..................... 523/425
4,211,475 7/1980 Malugani et al. ................ 252/518 X
4,297,004 10/1981 Nishimura et al. ................. 350/334
4,490,024 12/1984 de Warrens ......................... 350/363
4,547,310 10/1985 Kasanami et al. .................. 252/511

FOREIGN PATENT DOCUMENTS 2814824 10/1978 Fed. Rep. of Germany .

Primary Examiner—Josephine L. Barr
Attorney, Agent, or Firm—Fitzpatrick, Cella, Harper & Scinto

[57] ABSTRACT

An electro-optic display device in which a conductive paste is disposed between opposed electrodes is characterized in that said conductive paste contains silane coupling agents. A process for making an electro-optic display device in which a conductive paste is disposed between opposed electrodes is characterized in that said conductive paste is applied onto films which are formed by applying a silane coupling agent onto at least one of the electrodes.

5 Claims, 4 Drawing Figures

ELECTRO-OPTIC DISPLAY DEVICE AND A METHOD OF PRODUCING THE SAME

This is a division of application Ser. No. 271,993, filed June 9, 1981 now U.S. Pat. No. 4,587,038.

BACKGROUND OF THE INVENTION

1. Field of the Invention

The present invention relates to an electro-optic display device in which electro-optic display can be conducted by applying voltage, and a method of producing it, particularly to improvement in an electro-optic display device, for example, to improvement in an electric connection between electrodes in a liquid crystal display device.

2. Description of the Prior Art

In an electro-optic display device in which electro-optic display can be conducted by applying voltage, e.g., a liquid crystal display device, in order to simplify or ease connection between an electrode terminal section of an integrated circuit device for driving the electro-optic display device and a lead electrode of a liquid crystal display device, lead electrodes are concentrated on only one substrate (e.g., A) of two substrates (e.g., A and), each having an electrodes. In this case, in order to draw out an electrode on another substrate (B) to one substrate (A), a lead electrode is provided on another substrate (B) for short-circuit, and a conductive paste is disposed between the lead electrode on another substrate (B) and that on one substrate (A).

As the conductive paste, in general, there are used adhesives of organic resin type such as epoxy resin adhesives in which metallic powders such as silver, gold, copper, aluminum, and the like, and conductive carbon powder are mixed.

On the contrary, inorganic material such as indium oxide, tin oxide, and the like are generally used for electrodes. And the conductive paste has poor adhesiveness to the inorganic material. Therefore, a peeling occurs on the adhesive interface between the electrodes and the conductive paste during a preparing process of a liquid display device or on use for a long period, for these reasons the device loses the function of a liquid crystal display device.

SUMMARY OF THE INVENTION

It is an object of the present invention to provide an electro-optic display device in which electric connection between one pair of opposed electrodes is improved.

It is another object of the present invention to provide an electro-optic display device in which a conductive paste disposed between one pair of opposed electrodes is prevented from a peeling on the adhesive interface during use of the device for a long period.

It is a further object of the present invention to provide a preparing process for an electro-optic display device, in which a conductive paste disposed between one pair of opposed electrodes is prevented from a peeling on the adhesive interface during a preparing process of the device.

It is a still further object of the present invention to provide a preparing process for an electro-optic display device, in which electric connection between one pair of opposed electrodes is improved.

It is a still further object of the present invention to provide a preparing process for an electro-optic display device, in which a conductive paste disposed between one pair of opposed electrodes is prevented from a peeling on the adhesive interface during use of the device for a long period.

It is a still further object of the present invention to provide a liquid crystal display device in which electric connection between one pair of opposed electrodes is improved.

It is a still further object of the present invention to provide a liquid crystal display device in which a conductive paste disposed between one pair of opposed electrodes is prevented from a peeling on the adhesive interface during use of the device for a long period.

It is a still further object of the present invention to provide a preparing process for a liquid crystal display device, in which a conductive paste disposed between one pair of opposed electrodes is prevented from a peeling on the adhesive interface during a preparing process of the device.

It is a still further object of the present invention to provide a preparing process for a liquid crystal display device, in which electric connection between one pair of opposed electrodes is improved.

It is a still further object of the present invention to provide a preparing process for a liquid crystal display device, in which a conductive paste disposed between one pair of opposed electrodes is prevented from a peeling on the adhesive interface during use of the device for a long period.

Other objects of the present invention will be apparent from a reading of the following description.

According to one aspect of the present invention, there is provided an electro-optic display device in which a conductive paste is disposed between opposed electrodes, characterized in that said conductive paste contains a silane coupling agent.

According to another aspect of the present invention, there is provided a process for making an electro-optic display device in which a conductive paste is disposed between opposed electrodes, characterized in that said conductive paste is applied onto films which are formed by applying a silane coupling agent onto at least one of the electrodes.

DESCRIPTION OF THE PREFERRED EMBODIMENTS

Figure 1:
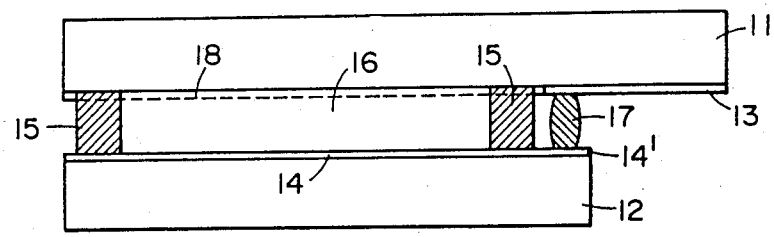
FIG. 1 is a sectional view of an electro-optic display device according to the present invention.

The types of silane coupling agents suitable for use in the present invention include organic silicone monomers that possess at least two different kinds of reactive radicals.

Types of the silicon portion in the silane coupling agents include methoxy-, ethoxy-, methoxycarbonyl-, silanolradical, and the like. Types of organic functional groups in the organic portion in silane coupling agents include vinyl-, epoxy-, methacryl-, amino-, mercaptradical, active halogen, and the like. The representative compunds are exemplified below.

Representative example of Compounds (1) γ-Glycidoxypropyltrimethoxysilane
$$CH_2\underset{O}{\overset{}{\diagdown\!\diagup}}CHCH_2O(CH_2)_3Si(OCH_3)_3$$

(2) γ-Methacryloxypropyltrimethoxysilane
$$CH_2=\underset{CH_3}{\overset{|}{C}}-\underset{O}{\overset{||}{C}}O(CH_2)_3Si(OCH_3)_3$$

(3) N—(β-aminoethyl)-γ-aminopropyltrimethoxysilane
$$H_2N(CH_2)_2NH(CH_2)_3Si(OCH_3)_3$$

(4) N—methyl-γ-aminopropyltrimethoxysilane
$$CH_3-NH(CH_2)_3Si(OCH_3)_3$$

(5) Vinyltrichlorosilane
$$CH_2=CHSiCl_3$$

(6) Vinyltriethoxysilane
$$CH_2=CHSi(OC_2H_5)_3$$

(7) Vinyl-tris-(β-methoxyethoxy)-silane
$$CH_2=CHSi(OC_2H_4OCH_3)_3$$

(8) N—(β-aminoethyl)-γ-aminopropyl-methyldimethoxysilane
$$H_2N(CH_2)_2NH(CH_2)_3\underset{\underset{CH_3}{|}}{Si}(OCH_3)_2$$

(9) γ-Chloropropyltrimethoxysilane
$$Cl(CH_2)_3Si(OCH_3)_3$$

(10) γ-Mercaptopropyltrimethoxysilane
$$HS(CH_2)_3Si(OCH_3)_3$$

(11) γ-Aminopropyltriethoxysilane
$$H_2N(CH_2)_3Si(OC_2H_5)_3$$

(12) N—[β-(N—Allylamino)-ethyl]-γ-aminopropyltrimethoxysilane hydrochloride
$$(CH_3O)_3Si(CH_2)_3NH(CH_2)_2NHCH_2CH=CH_2\cdot HCl$$

(13) N—[β(N—Carboxymethylamine)ethyl]-γ-aminopropyl-trimethoxysilane
$$(CH_3O)_3Si(CH_2)_3NH(CH_2)_2NHCH_2COOH$$

(14) N—Allyl-γ-aminopropyltrimethoxysilane
$$(CH_3O)_3Si(CH_2)_3NHCH_2CH=CH_2$$

(15) γ-Anilinopropyltrimethoxysilane
$$(CH_3O)_3Si(CH_2)_3NH-\!\!\left\langle\!\!\bigcirc\!\!\right\rangle$$

(16) Vinyltriacetoxysilane
$$(CH_3COO)_3SiCH=CH_2$$

(17) Chloromethyltrimethoxysilane
$$(CH_3O)_3SiCH_2Cl$$

These silane coupling agents can be included in a conductive paste by adding and mixing alone or by combination of the silane coupling agents. In this case, it is theoretically expected that an amount of the silane coupling agents capable of forming monomolecular layer thereof on an adhesive interface is adequate for the purposes of the present invention. However, excellent results can be obtained in an amount from 0.05 to 10% by weight of the silane coupling agents and, preferably, from 0.5 to 5% by weight in practice. In the absence of silane coupling agents, water molecule in air penetrates an adhesive interface, and a peeling is ultimately caused on the interface. As the result, electrical connection is lost so that a liquid crystal display device can not perform the function thereof.

In the present invention, the electric connection between one pair of opposed electrodes can be kept over long period by mixing the silane coupling agents into a conductive paste, or by previously applying the silane coupling agents onto the surface of the electrodes onto which the conductive paste adheres.

As previously described, types of the conductive paste that are suitable for use in the present invention include organic resin adhesives in which metallic powders such as silver, gold, copper, aluminum, and the like, and conductive carbon powder are dispersed. Types of the organic resin adhesives include copolymer resins of ethylene and propylene, and unsaturated polyester resins as well as adhesives of epoxy resins. Examples of the conductive paste include conductive pastes on the market such as "Conductive Paste H - 31D" (supplied by American Epoxy Technology Co. Ltd.) in which silver powder is dispersed.

The present invention will now be described with reference to the accompanying drawings. Particularly, description will be offered in accordance with embodiments in which a liquid crystal display device is used as an electro-optic display device.

In FIG. 1, a conductive paste 17 containing silane coupling agents is arranged between a lead electrode section 13 for short circuit and a lead electrode section 14' in order that the lead electrode section 14' led from an electrode 14 on a substrate 12 is drawn out to another substrate 11. Reference numeral 18 represents one of two electrodes which sandwich a liquid crystal material 16. Reference numeral 15 represents a sealing material.

Figure 2:
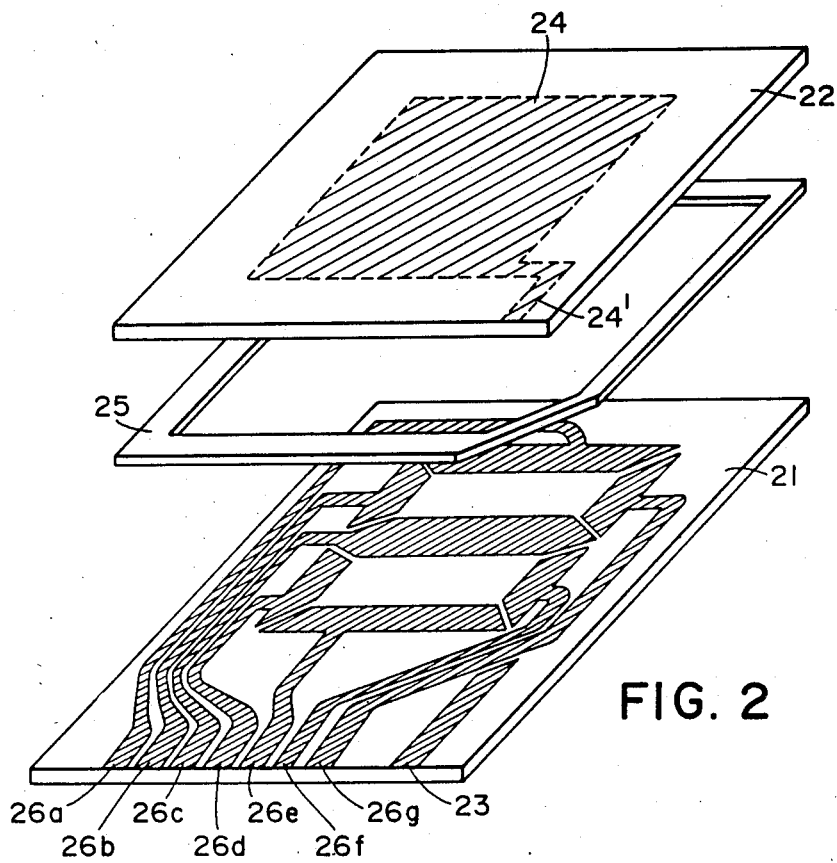
FIG. 2 is a perspective illustration of an electro-optic display device employed in the present invention.

FIG. 2 is a perspective illustration of a liquid crystal display device. A conductive paste is arranged between a lead electrode section 24' and a lead electrode section 23 for short circuit faced to the lead electrode section 24'. A liquid crystal material is sealed between substrates 21 and 22 through a sealing material 25. When a voltage is applied between the lead electrode section 23 for short circuit and the lead electrode sections 26a–26g led from other electrodes, a desired character is displayed.

Types of the display process suitable for use in the present invention include a process using dynamic scattering phenomenon which nematic liquid crystal material having negative dielectric anisotropy scatters light by applying an electric field, and a process using a phenomenon in which nematic liquid crystal material having positive dielectric anisotropy is endowed with an optical rotatory power by horizontally twisted alignment so that the optical rotatory power can be changed by suitable action of an electric field. Types of the liquid crystal material suitable for use in the present invention include smetic liquid crystal and cholesteric liquid crystal as well as the abovementioned nematic liquid crystal. These are used not alone, but by the combination of two or more liquid crystals.

As an electrode can be used thin films of such as tin oxides, indium oxides, and the like, disposed by vacuum deposition process on a part of or a whole surface of one surface of a substrate, if necessary, aluminum, silver, copper, zinc, tungsten, and the like can be used. Representative examples of the substrate supporting the electrode are transparent glass, transparent plastics, and the like.

Silane coupling agents suitable for use in the present invention may be applied onto a predetermined place of an electrode by a method such as screen printing method, dipping coating method, spinner coating method, brush coating method, hair pencil coating method, and the like. For example, the silane coupling agents are preferably used after dilution with diluents such as benzene, toluene, xylenes, and the like. Theoretically, it is expected that a concentration of the silane coupling agents capable of forming monomolecular layer thereof on an electrode is adequate for the purposes of the present invention. However, silane coupling agents are preferably used in a concentration in the range of 0.001-5% by weight, depending upon a type of application. When silane coupling agents are prevented from applying onto a region except for an intended region, it is possible to apply covering coat onto the region except for the intended region. Solvents in applied silane coupling agents are eliminated by air drying, heat drying, or the like to form a film.

Figure 4:
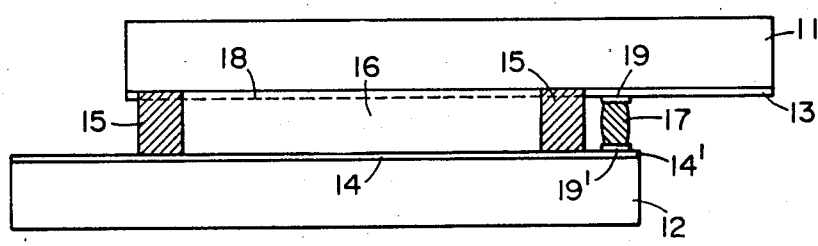
FIG. 4 is a sectional view of an electro-optic display device prepared according to the present invention.

FIG. 4 is a sectional view of an electro-optic display device prepared in a way that silane coupling agents are previously applied onto two electrodes to dispose a conductive paste between them. In FIG. 4, the same reference numerals as those in FIG. 1 are used to denote identical members with those in FIG. 1. Reference numerals 19 and 19' represent two films which are formed by applying silane coupling agents on parts to be stuck with a conductive paste, each of a lead electrode 13 for short circuit and of a lead electrode 14'. FIG. 4 shows an embodiment that a conductive paste 17 is disposed between the films 19 and 19'.

Types of electro-optic display device suitable for use in the present invention include, besides the previously described liquid crystal display device, liquid state electrochromic display devices described in U.S. Pat. Nos. 4,073,570 and 4,116,535, and DE-OS No. 2814824, and a solid state electrochromic display device described in U.S. Pat. No. 4,059,341 and the like.

The present invention will be explained by reference to the following examples.

EXAMPLE 1

Figure 3:
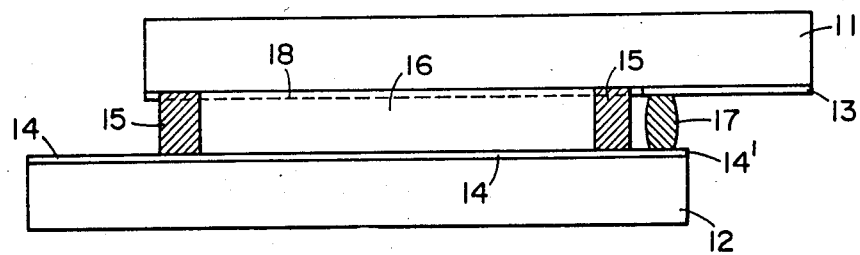
FIG. 3 is a sectional view of the electro-optic display device employed in the Examples of the present invention.

A liquid crystal display device shown in FIG. 3 was used for a display device in this example (In FIG. 3, the same numerals as those in FIG. 1 are identical with those components in FIG. 1). In other words, end portions of opposite substrates 11 and 12 were projected in order to measure the electrical connection of a conductive paste 17 with electrodes, so that the electrical connection between projected portions of electrodes 13 and 14 could be checked by using a tester.

In a process for preparing a liquid crystal display device having two opposite substrates 11 and 12 which were provided with transparent conductive electrodes 14 and 18 of indium oxides sandwiching liquid crystal material 16, and lead electrode sections 13 and 14' of indium oxides, respectively; epoxy adhesive was applied onto the substrate 11 by screen printing method for use as a sealing member 15, and a conductive paste containing 3% of the previously described compound 1 by weight as a silane coupling agent in Conductive paste H-31D (supplied by Epoxy Technology Co. Ltd.) in which silver powder was dispersed into adhesives of epoxy type was applied onto the substrate 12 by screen printing method for use as the conductive paste 17. Then, the substrates 11 and 12 were pressurized and heated at 150° C. for one hour to prepare the liquid crystal display device shown in FIG. 3.

On the other hand, there was prepared another liquid crystal display device by repeating the above-mentioned procedure except that the conductive paste free from silane coupling agents was used for comparison.

Firstly, an electric resistance between 13 and 14 was determined with regard to both devices, respectively (initial test). Then, after standing both devices under the circumstances of 80° C. and 90% RH for 500 hours, both devices were taken out and stood at room temperature for 24 hours to determine the electric resistance in a similar manner to that described above with regard to both devices, respectively (aging test). These results are shown in Table 1. (These results are represented by evaluating the number of devices having an electric resistance between 13 and 14 over 30 K$\Omega$ with regard to 50 devices according to the present invention and the comparative method, respectively.)

TABLE 1

| Sample | Silane coupling agents | Initial test | Aging test |
| --- | --- | --- | --- |
| | (Number of devices having electric resistance over 30K$\Omega$/Number of samples) | | |
| Device according to the invention | The previously described compound (1) | 0/50 | 0/50 |
| Device according to the comparative test | None | 3/50 | 17/50 |

As apparent from Table 1 reliability of the electric connection is significantly enhanced by using a conductive paste containing silane coupling agents.

EXAMPLE 2

Tests were repeated in a similar manner to that described in Example 1 except that the exemplified compounds (2), (4), (6) and (14) were used in the place of the exemplified compound (1), respectively. Similar results were obtained.

EXAMPLE 3

A liquid crystal display device shown in FIG. 3 was used for a display device in this example. In other words, end portions of opposite substrates 11 and 12 were projected in order to measure the electrical connection of a conductive paste 17 with electrodes, so that the electrical connection between projected portions of electrodes 13 and 14 could be checked by using a tester.

In a process for preparing a liquid crystal display device having two opposite electrodes 11 and 12 which were provided with transparent conductive electrodes 14 and 18 of indium oxides sandwiching liquid crystal material 16, and lead electrode sections 13 and 14' of indium oxides, respectively; a silane coupling agent (the previously described compound 1)isopropylalcohol solution (1% by weight) was applied onto portions where a conductive paste is applied to the lead electrodes 13 and 14' by using a hair pencil, followed by evaporating isopropylalcohol at 100° C. for 15 minutes. Then an epoxy adhesive was applied onto the substrate 11 by screen printing method for use as a sealing member 15, and Conductive paste H-31D (supplied by Epoxy Technology Co. Ltd.) in which silver powder was dispersed into adhesives of epoxy type was applied onto the portion of the lead electrode 14' on the substrate 12, where the silane coupling agent was previously applied, by using screen printing method. Subsequently, substrates 11 and 12 were superposed upon each other, and pressurized and heated at 150° C. for one hour to prepare the liquid crystal display device shown in FIG. 3.

On the other hand, there was prepared another liquid crystal display device by repeating the above-mentioned procedure except that lead electrodes free from application of the silane coupling agent were used for comparison.

Firstly, an electric resistance between 13 and 14 was determined with regard to both devices, respectively (initial test). Then, after standing both devices under the circimstances of 80° C. and 90% RH for 500 hours, both devices were taken out and stood at room temperature for 24 hours to determine the electric resistance in a similar manner to that described above with regard to both devices, respectively (aging test). These results are shown in Table 2. (These results are represented by evaluating the number of devices having an electric resistance between 13 and 14 over 30 KΩ with regard to 50 devices according to the present invention and the comparative method, respectively.)

TABLE 2

| | (Number of devices having electric resistance over 30KΩ/Number of samples) | | |
|---|---|---|---|
| Sample | Silane coupling agents | Initial test | Aging test |
| Device according to the invention | The previously described compound (1) | 0/50 | 0/50 |
| Device according to the comparative test | None | 3/50 | 17/50 |

As apparent from Table 2, reliability of the electric connection is significantly enhanced by applying a silane coupling agent onto portions of the lead electrodes where a conductive paste is stuck.

EXAMPLE 4

Tests were repeated in a similar manner to that described in Example 3 except that exemplified compounds (2), (4), (6) and (14) were used in the place of the exemplified compound (1), respectively. Similar results were obtained.

What I claim is:

1. An electroconductive adhesive for bonding a pair of electrodes formed of the material selected from the group consisting of metals, indium oxide and tin oxide comprising:
   (a) 0.05–10% by weight of an organic silicon monomer having a reactive silicon radical and a reactive organic radical;
   (b) at least one electroconductive powder selected from the group consisting of carbon, silver, gold, copper and aluminum powder in an amount sufficient to impart electroconductivity; and
   (c) an epoxy resin adhesive in an amount sufficient to impart adhesiveness.

2. An electroconductive adhesive according to claim 1, wherein the organic silicon monomer has at least two reactive organic radicals.

3. An electroconductive adhesive according to claim 2 wherein the organic silicon monomer has in the molecule at least one reactive radical selected from the group consisting of methoxy- ethoxy-, B-methoxyethoxy-, and methoxycarbonyl- radical.

4. An electroconductive adhesive according to claim 1 wherein the organic silane monomer has in the molecule at least one reactive radical selected from the group consisting of vinyl-, epoxy-, methacryl-, mercapt-, amino- radical, and active halogen atom.

5. An electroconductive adhesive according to claim 1 wherein the organic silicon monomer is at least one compound selected from the group consisting of:
   γ-glycidoxypropyltrimethoxysilane, γ-methacryloxypropyltrimethoxysilane, N-(β-aminoethyl)-γ-aminopropyltrimethoxysilane vinyl-tris-(β-methoxyethoxy)-silane, N-(β-aminoethyl)-γ-aminopropylmethyldimethoxysilane, γ-chloropropyltrimethoxysilane, γ-mercaptopropyltrimethoxysilane, γ-aminopropyltriethoxysilane, N-[β-(N-allylamino)ethyl]-γ-aminopropyltrimethoxysilane hydrochloride, N-[β-(N-carboxymethylamino)ethyl]-γ-aminopropyltrimethoxysilane, N-allyl-γ-aminopropyltrimethoxy- silane, γ-anilinopropyltrimethoxysilane, vinyltriacetoxysilane, and chloromethyltrimethoxysilane.

* * * * *

UNITED STATES PATENT AND TRADEMARK OFFICE
CERTIFICATE OF CORRECTION

PATENT NO. : 4,647,402

DATED : March 3, 1987

INVENTOR(S) : KATSUHIDE TAMURA

It is certified that error appears in the above-identified patent and that said Letters Patent is hereby corrected as shown below:

COLUMN 1

Line 26,   "and)," should read --and B),--.
    Line 26,   "electrodes" should read --electrode--.

COLUMN 2

Line 44,   "DRAWING" should read --DRAWINGS--.
    Line 64,   "silanolradical" should read --silanol-radical--.
    Line 68,   "compunds" should read --compounds--.

COLUMN 3

Line 2,   "example" should read --examples--.

COLUMN 4

Line 46,   "which" should read --in which--.

COLUMN 5

Line 29,   "that" should read --in which--.
    Line 31,   "device" should read --devices--.
    Line 36,   "solid state" should read --solid-state--.

UNITED STATES PATENT AND TRADEMARK OFFICE
CERTIFICATE OF CORRECTION

PATENT NO. : 4,647,402

DATED : March 3, 1987

INVENTOR(S) : KATSUHIDE TAMURA

It is certified that error appears in the above-identified patent and that said Letters Patent is hereby corrected as shown below:

COLUMN 7

Line 11, "circimstances" should read --circumstances--.

COLUMN 8

Line 20, "methoxy-" should read --methoxy-,--.

Signed and Sealed this

Eighth Day of September, 1987

Attest:

DONALD J. QUIGG

Attesting Officer

Commissioner of Patents and Trademarks